United States Patent [19]

Yagi

[11] Patent Number: 4,635,325
[45] Date of Patent: Jan. 13, 1987

[54] SUBSTRATE FASTENER
[75] Inventor: Masaru Yagi, Tsushima, Japan
[73] Assignee: Kitagawa Industries Co., Ltd., Nagoya, Japan
[21] Appl. No.: 755,585
[22] Filed: Jul. 16, 1985
[30] Foreign Application Priority Data
  Oct. 3, 1984 [JP] Japan .................... 59-207629
[51] Int. Cl.⁴ .................... F16B 5/06; H05K 13/00
[52] U.S. Cl. .................... 24/453; 24/305; 24/297; 174/138 D; 411/508; 361/412
[58] Field of Search ............... 24/453, 297, 289, 305; 411/508, 509, 510; 174/138 D; 361/352, 412, 413; 339/17 LM; 248/73, 74.3

[56] References Cited

U.S. PATENT DOCUMENTS

| 3,378,730 | 4/1968 | Poehls | 361/413 |
| 3,599,920 | 8/1971 | Hoegerl | 339/17 LM |
| 3,651,545 | 3/1972 | Hara | 174/138 D |
| 3,688,635 | 9/1972 | Fegen | 174/138 D |
| 3,764,729 | 10/1973 | Kowalewski | 174/138 D |
| 3,777,052 | 12/1973 | Fegen | 174/138 D |
| 3,909,883 | 10/1975 | Fegen | 174/138 D |
| 3,924,918 | 12/1975 | Friend | 361/412 |
| 4,457,482 | 7/1984 | Kitagawa | 248/73 |
| 4,550,362 | 10/1985 | Reimer | 361/413 |

FOREIGN PATENT DOCUMENTS

| 1061914 | 9/1979 | Canada | 174/138 D |
| 2111579 | 7/1983 | United Kingdom | 24/289 |

Primary Examiner—Victor N. Sakran
Attorney, Agent, or Firm—Oblon, Fisher, Spivak, McClelland, & Maier

[57] ABSTRACT

Described herein is a substrate fastener having resilient coupling members at the opposite ends of a strut member, characterized in that the coupling members are resiliently engageable in mounting holes of substrates to be fastened to each other, and at least one of the coupling members is connected to the strut member through a flexible hinge of a synthetic resin material. Accordingly, the fastener occupies only small areas on the substrates, permitting to mount electronic parts on the substrates in higher packaging density. The connected substrates can be freely turned into a horizontal or vertical position if desired.

6 Claims, 6 Drawing Figures

SUBSTRATE FASTENER

BACKGROUND OF THE INVENTION

1. Field of the Invention

This invention relates to a substrate fastener to be fitted on substrates of printed circuit boards or chassis of electronic instruments or appliances for connecting or fixing a plural number of substrates substantially at right angles or at an askew angle to each other.

2. Description of the Prior Art

For example, substrates of printed circuits which are erected in upright positions on a chassis of an electronic instrument are usually connected by directly soldering their circuits or by the use of a connector. When mounting printed circuit boards in such upright positions, it has been the conventional practice to fix a large substrate retainers 21 opposingly on a horizontal substrate by means of screws and to hold side edge portions of the upright substrate in the grooves on the inner side of the substrate retainers. Therefore, stability of the vertical substrates depends upon the width and height of the retainers, as a result, it is necessary to use retainers of a large size. Use of large retainers limits the number of elements of vertical substrates which can be mounted on a horizontal substrate, or, namely, the packaging density of printed circuit boards which can be mounted on a horizontal substrate.

SUMMARY OF THE INVENTION

With the foregoing situations in view, the present invention has the provision of a substrate fastener which can overcome the above-mentioned problems or difficulties and which is arranged in the manner as follows.

Namely, according to the present invention, there is provided a substrate fastener which is provided with resilient coupling members on opposite ends of a strut member, the resilient coupling members being resiliently engageable in mounting holes provided in substrates to be connected, and one or both of the resilient coupling members being secured to the strut member through a flexible hinge of a synthetic resin material.

Since the substrate fastener has a resilient coupling member or members flexibly attached to strut member through the flexible hinge as mentioned above, it is possible to fit the resilient coupling members in mounting holes in the horizontal and vertical substrates at an askew angle with the respective substrates, which are connected to the other ends by means for suitable connecting. Thus, the two substrates can be supported at a right angle or at an arbitrary angle with each other by the round member. When the means for connecting at the other end of one substrate is removed, its freed end can be turned about the hinge of a synthetic resin to assume an arbitrary angular position relative to the other substrate thereby to facilitate repair or inspection of the printed circuit. In addition, since the substrate fastener can be used as a small diagonal strut, it occupies only small areas on the substrates, permitting to mount electronic elements on the substrates in higher density.

The above and other objects, features and advantages of the invention will become apparent from the following description and the appended claims, taken in conjunction with the accompanying drawings which show by way of example some preferred embodiments of the invention.

DESCRIPTION OF PREFERRED EMBODIMENTS

Figure 1:
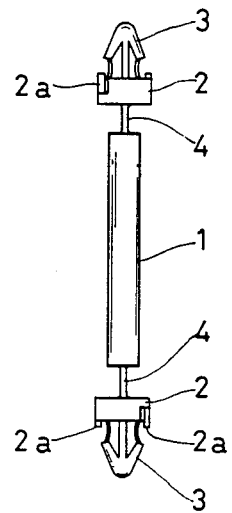
FIG. 1 is a front view of a substrate fastener according to the invention.

Hereafter, the invention is described more particularly by way of the preferred embodiments shown in the drawings.

Figure 2:
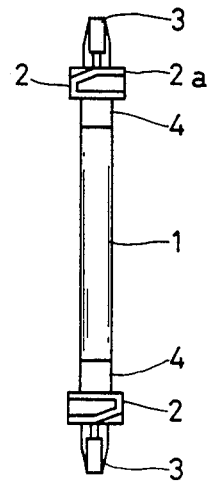
FIG. 2 is a side view of the fastener of FIG. 1.

Referring to FIGS. 1 and 2, there is shown a first embodiment of the invention in front and side views, wherein indicated at 1 is a rod-like strut member which is provided with a resilient coupling member 3 at the opposite ends thereof through a flexible hinge 4 of a synthetic resin material, the resilient coupling member 3 each having a resilient support portion 2 in a base portion thereof. The flexible hinge 4 is in the form of a plate-like synthetic resin material capable of elastic deformation. Formed at the fore end of the flexible hinge 4 is a resilient support member 2 which has resilient support strips 2a protruded from the opposite sides in direction away from each other. Provided at the outer end of the resilient support member 2 is the resilient coupling member 3 to be fitted in a mounting hole of a printed circuit board or the like by elastic deformation, and locked therein by spreading its arm portions which are protruded on the other side of the printed circuit board. Namely, the resilient coupling member 3 includes a stem portion which is extended out from a center portion of the resilient support member 2, arm portions which are extended toward the resilient support member 2 from the free end of the stem, and thin wall portions which connect the fore end portions of the arms with the resilient support member 2.

Figure 3:
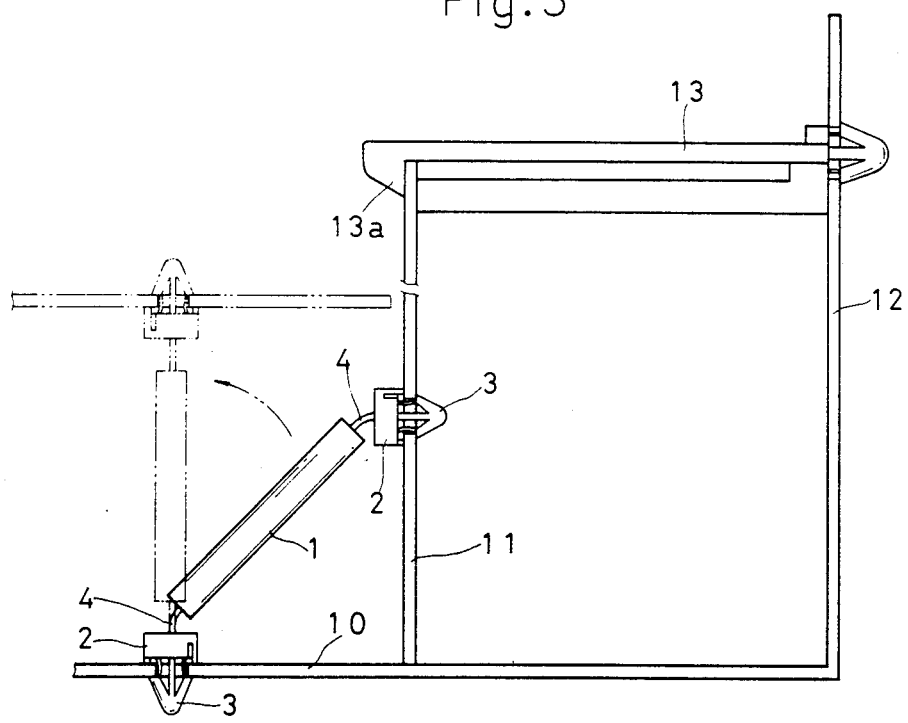
FIG. 3 is a side view of the fastener in use.

The substrate fastener of the above-described construction is integrally formed of a resilient synthetic resin material such as nylon or the like, and, for example, the resilient coupling members 3 are fitted in mounting holes in corner portions of horizontal and vertical substrates 10 and 11 which are disposed substantially at a right angles to each other as shown in FIG. 3, securely connecting the vertical substrate 11 to the horizontal substrate 10 by diagonally disposed strut member 1. That is to say, the resilient coupling member 3 at the upper end of the fastener is first fitted in the mounting hole of the vertical substrate 11 which is held in upright state on the horizontal substrate 10, and then the resilient coupling member 3 at the lower end of the fastener is fitted in the mounting hole in the horizontal substrate 10. At this time, marginal edge portions of the respective mounting holes are gripped between the resilient support strips 2a of the resilient support members 2 and the coupling members 3. The strut member 1 is disposed at the angle of about 45 degrees, while the resilient coupling members 3 at the opposite ends of the strut member 1 are held at the angle of about 135 degrees with the strut 1 by the flexible hinges 4. On the other hand, the upper end of the vertical substrate 11 is gripped in a gripping portion 13a at one end of an end gripper 13 which is fitted at the other end in another vertical substrate 12, thereby holding the vertical substrate 11 in upright state.

Thus, the vertical substrate 11 is fixedly supported on the horizontal substrate 10 in a simple and secure manner. In a case where there arises a necessity for turning the vertical substrate 11 into a horizontal position for repair or insepction, the vertical substrate 11 can be easily turned upon removing the gripping portion of the end gripper 13 from its end, permitting to assume a horizontal position as shown in phantom line in FIG. 3 or other inclined positions, by means of the flexible hinge 4.

Figure 4:
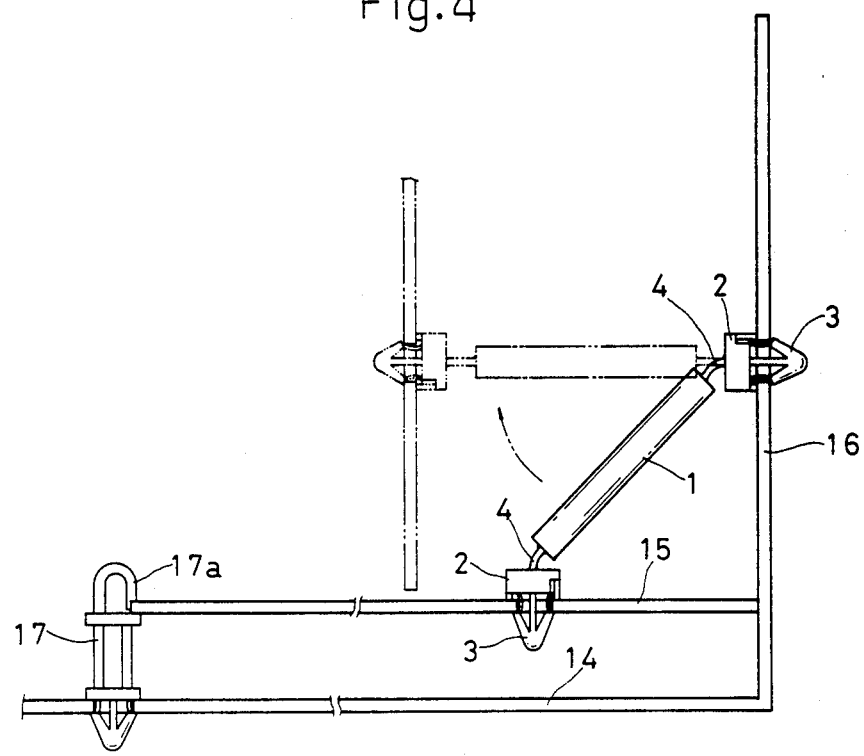
FIG. 4 is a view similar to FIG. 3 but showing the fastener used in a different manner.

Illustrated in FIG. 4 is an example of connecting a horizontal substrate 15 on another horizontal substrate 14 in spaced relationship with each other by use of the above-described substrate fastener of the invention. In this case, the resilient coupling member 3 at the upper end is fitted in a mounting hole of a vertical substrate 16, fitting the other resilient coupling member 3 at the lower end of the fastener in a mounting hole of the horizontal substrate 15. Similar to the above-described case, the resilient coupling members 3 at the opposite ends of the fastener are bent to an angle of about 45 degrees with the strut member 1 by the flexible action of the synthetic resin hinge 4, the strut member 1 which is disposed at an angle of about 45 degrees holding the upper horizontal substrate 15 in a horizontal position relative to the vertical substrate 16. The fore end of the horizontal substrate 15 is held in a gripping portion 17a of an end gripper 17 which is fixedly mounted on the lower horizontal substrate 14, supporting the horizontal substrate 15 spacedly over the lower horizontal substrate 14. In a manner similar to the above-described fastener, this substrate fastener can also be bent at the flexible resin hinge 4 and turned easily into a vertical position upon releasing its end from gripping portion of the end gripper 17.

Figure 5:
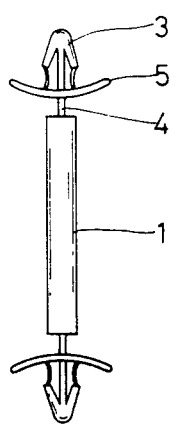
FIG. 5 is a front view of a second embodiment of the invention.

FIG. 5 illustrates a second embodiment of the invention, which is same as the foregoing embodiments in construction and operation except that the substrate fastener is provided with arcuate resilient support members 5 instead of the above-described resilient support members 2 at the opposite ends of a round rod-like flexible hinge 4 formed of synthetic resin 4.

Figure 6:
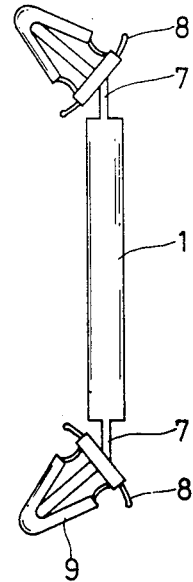
FIG. 6 is a front view of a third embodiments of the invention.

Shown in FIG. 6 is a third embodiment of the invention, wherein resilient coupling members 9 are connected to the opposite ends of a strut member 1 through the flexible hinges 7 of synthetic resin 7 and in tilted state, forming an angle of about 45 degrees with the strut member. The resilient coupling members 9 are provided with small resilient support strips 8 at the base portions thereof. When the strut member 1 of the substrate fastener is placed in a corner portion between horizontal and vertical substrates diagonally at an angle of 45 degrees as shown in FIGS. 3 and 4, the laterally and downwardly facing the resilient coupling members 9 can be easily fitted in mounting holes in the vertical and horizontal substrates, respectively. Further, if the end portion of the horizontal or vertical substrate is freed from the end gripper, the substrate can be turned about the flexible hinge 7 of synthetic resin 7 to assume an arbitrary angular position in the same manner as described hereinbefore.

Although the flexible hinges are provided at both ends of the strut with the resilient coupling members, it is of course possible to provide the flexible hinge only at one end of the strut member if desired.

What is claimed is:

1. A one piece synthetic resin substrate fastener for a printed circuit board connecting substrates at angles to one another, comprising:
   (a) an elongated strut member;
   (b) two opposed flexible thin walled hinges connected to opposite ends of said strut member;
   (c) resilient support member connected to fore ends of said flexible hinges; and
   (d) resilient coupling members extended out from said resilient support members, such that said coupling members is angled at 45° relative to said strut member and mutually angled by 90° due to the flexibility of said thin walled hinges;
   (e) said resilient coupling members each having a snag portion capable of spreading out after insertion in a mounting hole in one substrate for securely gripping said one substrate between the resilient support member and the resilient coupling member while permitting said one substrate connected to one said resilient coupling member to turn toward and away from another substrate connected to another resilient coupling member of said fastener by the resiliency of said flexible hinges, whereby a mounting density of said substrates is increased.

2. The substrate fastener according to claim 1, wherein said resilient support members are each provided with stepped portions at the opposite ends thereof and with resilient support strips extended out in opposite directions from said stepped portions.

3. The substrate fastener according to claim 1, wherein said resilient support members are each constituted by an arcuately curved plate-like strip extending toward said resilient coupling member and connected to said flexible hinge at a center portion thereof.

4. The substrate fastener according to claim 1, wherein said resilient support member has spherically shaped end portions and is tapered in a direction toward said end portions.

5. The substrate fastener according to claim 1 in combination with an elongated end gripper having one end fixed to said another substrate and having a gripping portion at a fore end thereof, wherein said one of said substrates is gripped in said gripping portion and said resilient coupling members are disposed at right angles to each other.

6. The substrate fastener according to claim 1, wherein said resilient coupling members each comprise:
   a stem portion extending out from a center portion of said resilient support member 2;
   a pair of arms extending from the free end of said stem portion toward said resilient support member 2; and
   thin wall portions connecting ends of said arms to said resilient support member 2.

* * * * *